United States Patent [19]

Jang

[11] Patent Number: 5,844,846
[45] Date of Patent: Dec. 1, 1998

[54] DATA OUTPUT BUFFER FOR MEMORY DEVICE

[75] Inventor: Seong-Jin Jang, Seoul, Rep. of Korea

[73] Assignee: LG Semicon Co., Ltd., Choongcheongbuk-Do, Rep. of Korea

[21] Appl. No.: 44,172

[22] Filed: Mar. 19, 1998

[30] Foreign Application Priority Data

Apr. 30, 1997 [KR] Rep. of Korea ............... 16590/1997

[51] Int. Cl.[6] .......................... G11C 7/00; H03K 17/16
[52] U.S. Cl. ...................... 365/189.05; 365/189.08; 326/28
[58] Field of Search .............. 365/189.05, 189.07, 365/189.08; 326/21, 26, 27, 28, 56, 81

[56] References Cited

U.S. PATENT DOCUMENTS

| | | | |
|---|---|---|---|
| 4,959,561 | 9/1990 | McDermott et al. | 326/27 |
| 5,089,722 | 2/1992 | Amedeo | 326/27 |
| 5,367,484 | 11/1994 | Alexander et al. | 365/185.09 |
| 5,646,550 | 7/1997 | Campbell, Jr. et al. | 326/81 |

*Primary Examiner*—David Nelms
*Assistant Examiner*—Trong Phan
*Attorney, Agent, or Firm*—Morgan, Lewis & Bockius LLP

[57] ABSTRACT

A data output buffer for a memory device having a memory chip includes a detection unit for detecting an external output data and outputting a detection data, a clock signal adjusting unit coupled to the detection unit for comparing the detection data from the detection unit and a data outputted from the memory chip in accordance with an externally applied clock signal and outputting a first signal and a second signal, and an output buffer unit coupled to the clock signal adjusting unit and outputting a data in accordance with the first signal and the second signal.

8 Claims, 6 Drawing Sheets

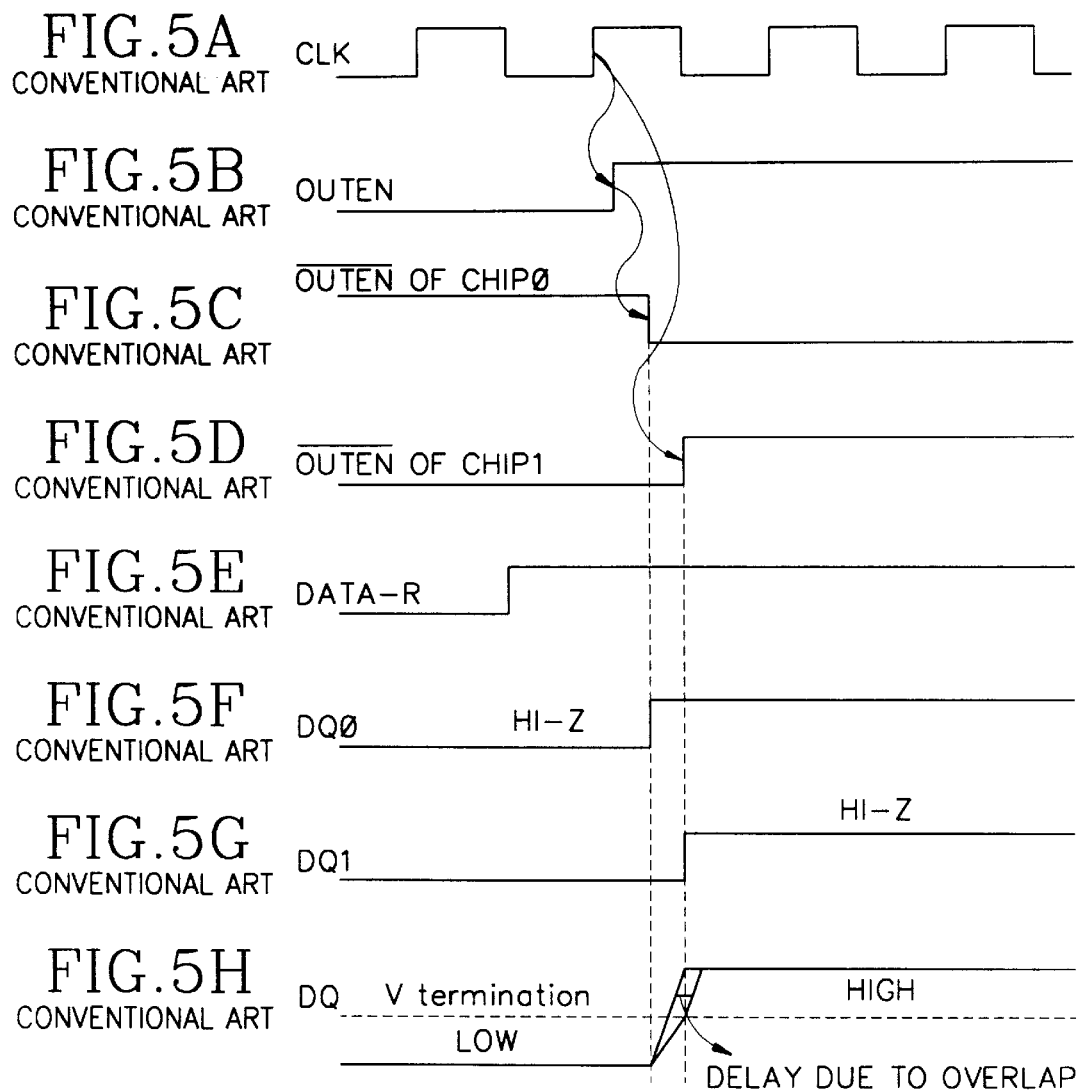

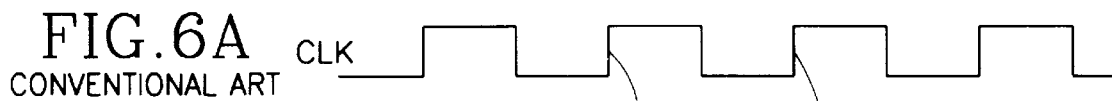
FIG.6A
CONVENTIONAL ART
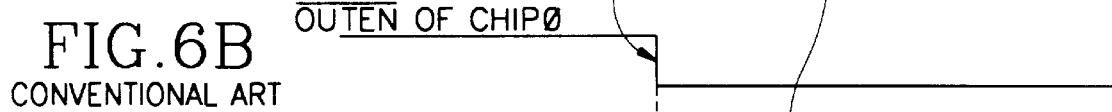
FIG.6B
CONVENTIONAL ART
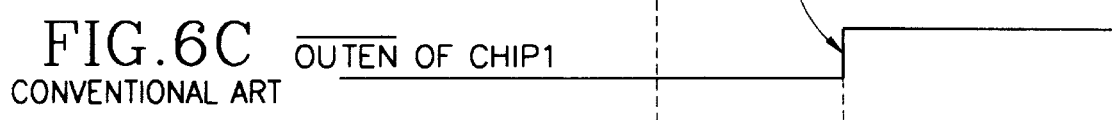
FIG.6C
CONVENTIONAL ART
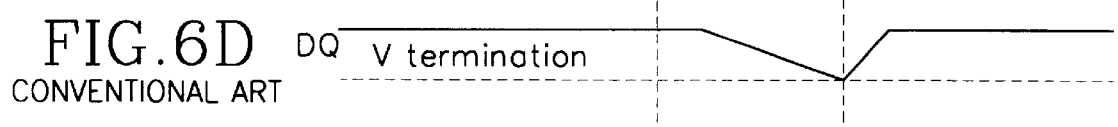
FIG.6D
CONVENTIONAL ART
FIG.7
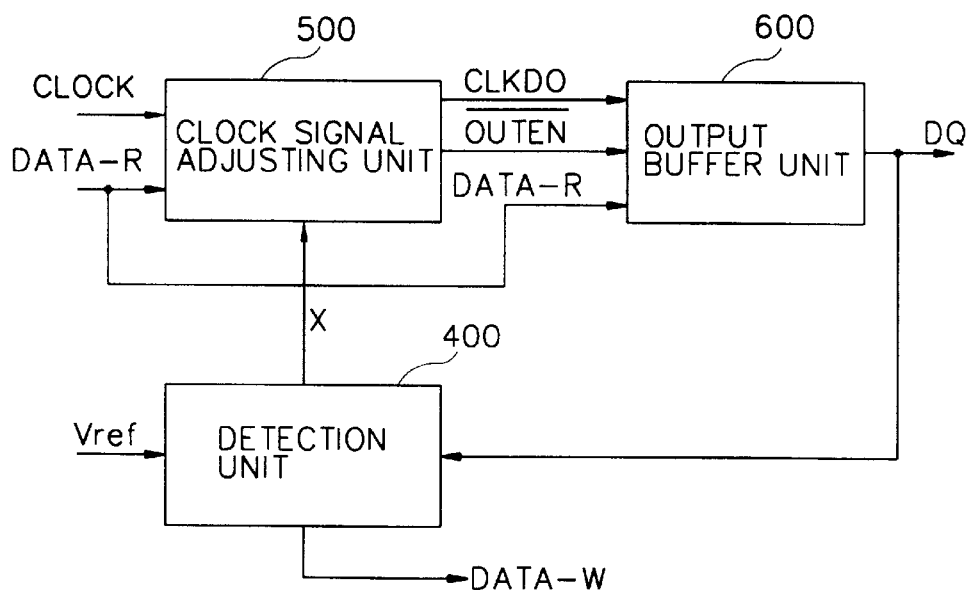

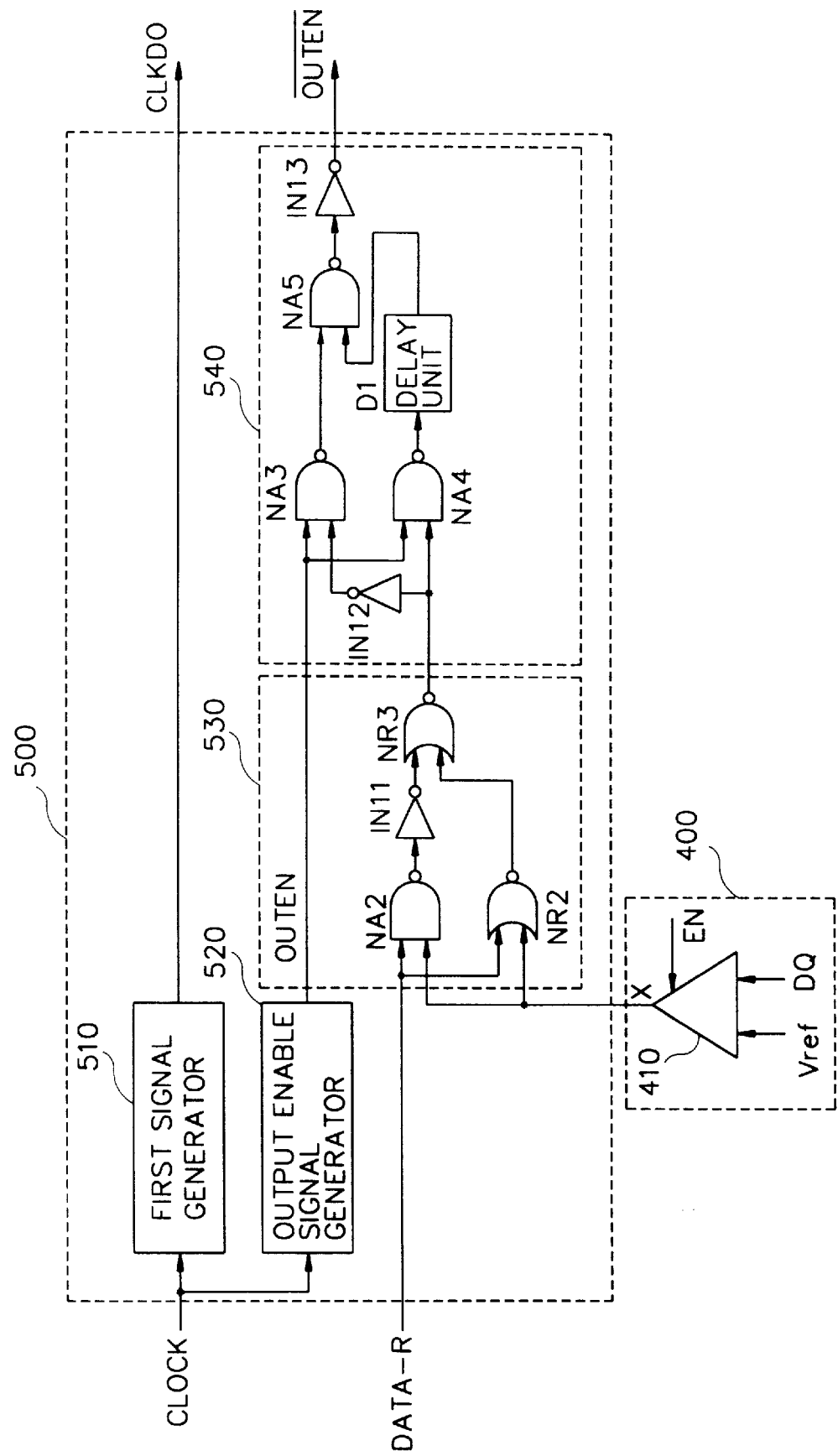

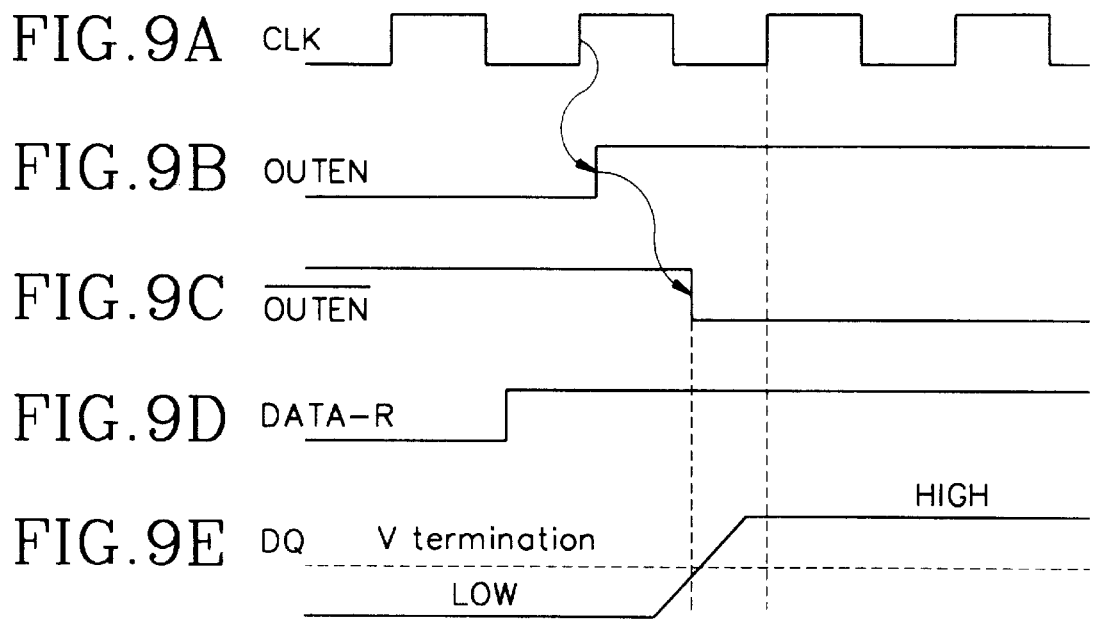
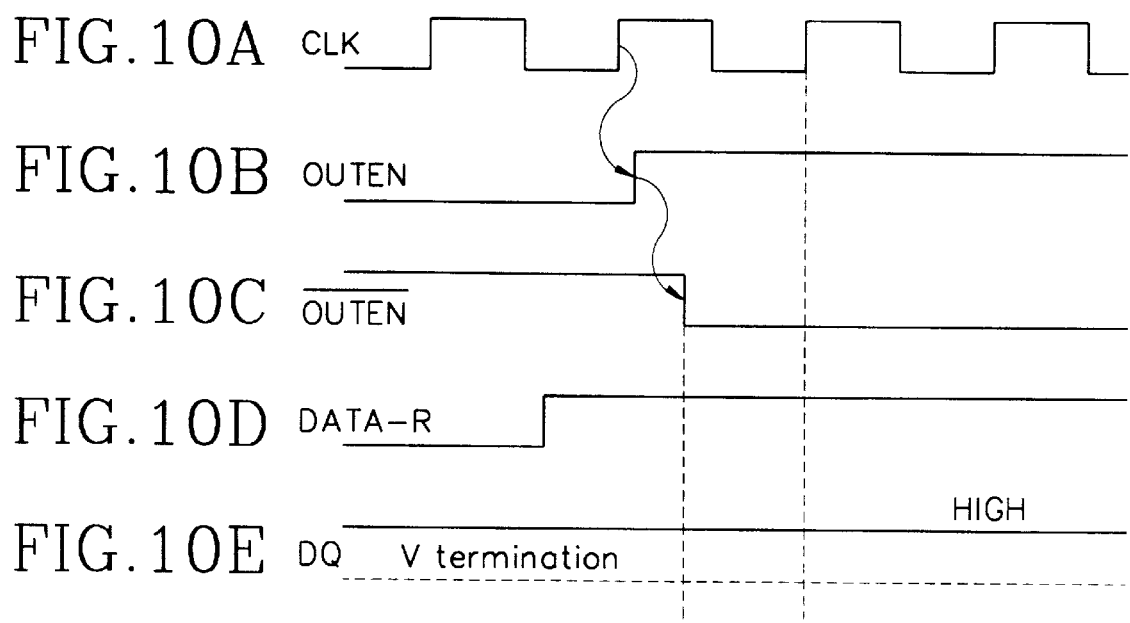

DATA OUTPUT BUFFER FOR MEMORY DEVICE

This application claims the benefit of Korean Application No. 16590/1997 filed on Apr. 30, 1997, which is hereby incorporated by reference.

BACKGROUND OF THE INVENTION

1. Field of the Invention

The present invention relates to a semiconductor memory device, and more particularly to a data output buffer for a memory device. Although the present invention is suitable for a wide scope of the applications, it is particularly suitable for eliminating a noise of a data output buffer and reducing an electric power consumption for a memory device.

2. Discussion of the Related Art

As shown in FIG. 1, a conventional data output buffer for a memory device includes a clock signal adjusting unit 100 for outputting a first signal CLKDO and a second signal $\overline{OUTEN}$ determining a time to output a data DATA-R in a memory cell (not shown) in accordance with an external clock signal CLOCK and enabling an output buffer. The conventional data output buffer also includes an output buffer unit 200 for outputting the data DATA-R in the device in accordance with the outputs CLKDO and $\overline{OUTEN}$ from the clock signal adjusting unit 100.

FIG. 2 illustrates a detailed diagram of the clock signal adjusting unit 100 shown in FIG. 1. The clock signal adjusting unit 100 includes a first signal generator 110 for generating the first signal CLKDO determining a time to output the data DATA-R in the device in accordance with the external clock signal. An output enable signal generator 120 generates an output enable signal OUTEN in accordance with the external clock signal clock. A plurality of invertors IN1, IN2 and IN3 sequentially delay and invert the output enable signal OUTEN outputted from the output enable signal generator 120 and thereby output the second signal $\overline{OUTEN}$.

In FIG. 3, a circuit diagram of the output buffer unit 200 is described in detail. The output buffer unit 200 includes a data latch unit 210 for latching the data DATA-R in the device to be outputted in accordance with the first signal CLKDO from the clock signal adjusting unit 100. An output enable unit 220 determines whether to output the data DATA-R in the device in accordance with the second signal $\overline{OUTEN}$ inputted from the clock signal adjusting unit 100 or to make the data DATA-R a HI-Z state. A driver unit 230 outputs the data DATA-R in the device in accordance with outputs from the output enable unit 220.

Further, the data latch unit 210 includes a first inverter IN4 for inverting the first signal CLKDO outputted from the clock signal adjusting unit 100. A second inverter IN5 inverts an output from the first inverter IN4. A first transmission gate TG1 transmits the data DATA-R in accordance with outputs from the first inverter IN4 applied to a non-inversion terminal and the second inverter IN5 applied to an inversion terminal. A first latch 211 having a pair of inverters IN6 and IN7 latches an output from the first transmission gate TG1. A second transmission gate TG2 for transmitting a data outputted from the first latch 211 in accordance with the outputs from the first inverter IN4 applied to a non-inversion terminal and the second inverter IN5 applied to an inversion terminal. A second latch 212 having a pair of inverters IN8 and IN9 latches an output from the second transmission gate TG2.

The output enable unit 220 includes a NAND gate NA1 for performing an inversion AND operation of an output from the data latch unit 210 and an inverted signal of the second signal $\overline{OUTEN}$ outputted from the clock signal adjusting unit 100. The output enable unit 220 also includes a NOR gate NR1 for performing an inversion OR operation of the output from the data latch unit 210 and the second signal $\overline{OUTEN}$ outputted from the clock signal adjusting unit 100.

The driver unit 230 includes a PMOS transistor PM1 and a NMOS transistor MN1 having a respective gate for receiving each output from the NAND gate NA1 and the NOR gate NR1 of the output enable unit 220 and a common drain connected between a power supply voltage Vcc and a ground voltage Vss. A commonly connected drain terminal becomes an output terminal of the output buffer unit 200.

FIG. 4 illustrates a plurality of data output buffers which are modularized. The data output buffers are controlled by each allotted data in the device and externally applied clock signal.

Operation of the conventional data output buffer for a memory device will now be described with reference to FIGS. 5A to 5H.

When the clock signal adjusting unit 100 generates the first and the second signal CLKDO and $\overline{OUTEN}$, as shown in FIG. 5B, 5C, and 5D, having a certain delay time with respect to an external clock, as shown in FIG. 5A, the driver unit 230 of the output buffer unit 200 becomes a LO-Z state from a HI-Z state in accordance with the second signal $\overline{OUTEN}$.

Here, HI-Z means a high impedance state when an electric current is not able to flow to an output terminal. Conversely, LO-Z is a low impedance state when the electric current can flow to the output terminal.

When the data DATA-R to be outputted from the device is transmitted to the data latch unit 210, the data DATA-R is latched at the point of a rising edge of the clock signal in the data latch unit 210 and then transmitted to the driver unit 230. As shown in FIG. 5E, the driver unit 230 enabled by the second signal $\overline{OUTEN}$ externally outputs the data DATA-R transmitted from the data latch unit 210. The above operation is repeated in every clock cycle.

However, when the plurality of data output buffers are used as a module and the data DATA-R is different from the previous output data DQ, two memory chips in FIG. 4 become an on-state due to the delay of data transmission times between surrounding modules, as shown in FIGS. 5C and 5D. As a result, as shown in FIGS. 5F, 5G, and 5H, an overlap current is generated, thereby causing a noise to the output data DQ.

To prevent this problem, the output buffer unit should be delayed in outputting a data until an output of one of the memory chip has become completely off (after waiting for one clock cycle) and then outputs the data through enabling another memory chip.

If the data DATA-R is identical to the previous output data DQ, as shown in FIGS. 6A, 6B, and 6C, an output from the previous chip is in an off-state for about one clock cycle. Thus, the data DQ is lowered to a termination voltage level, and it has to be raised to a desired level, as shown in FIG. 6D. As a result, an unnecessary power consumption occurs in the memory device.

SUMMARY OF THE INVENTION

Accordingly, the present invention is directed to a data output buffer for memory device that substantially obviates one or more of the problems due to limitations and disadvantages of the related art.

An object of the present invention is to provide a data output buffer for a memory device detecting an external output data of a DRAM, determining an output enable time of a DRAM, eliminating an overlap current between DRAMS, thereby reducing unnecessary electric power consumption.

Another object of the present invention is to provide a data output buffer for a memory device enhancing an operation speed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a data output buffer having a memory chip includes a detection unit for detecting an external output data and outputting a detection data, a clock signal adjusting unit coupled to the detection unit for comparing the detection data from the detection unit and a data outputted from the memory chip in accordance with an externally applied clock signal and outputting a first signal and a second signal, and an output buffer unit coupled to the clock signal adjusting unit and outputting a data in accordance with the first signal and the second signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 5A–5H are signal wave form diagrams when an output data and a data in a memory chip are different from the data in FIG. 1;

FIGS. 6A–6D are a signal wave form diagrams when an output data and a data in a memory chip are identical with the data in FIG. 1;

FIG. 7 is a block diagram illustrating a data output buffer for a memory device according to the present invention;

FIG. 8 is a circuit diagram illustrating a clock signal adjusting unit and a detection unit shown in FIG. 7;

FIGS. 9A–9E are signal wave form diagrams when an output data and a data in a memory chip are different from the data in FIG. 7; and FIGS. 10A–10E are signal wave form diagrams when an output data and a data in a memory chip are identical with the data in FIG. 7.

DETAILED DESCRIPTION OF THE INVENTION

Figure 1:
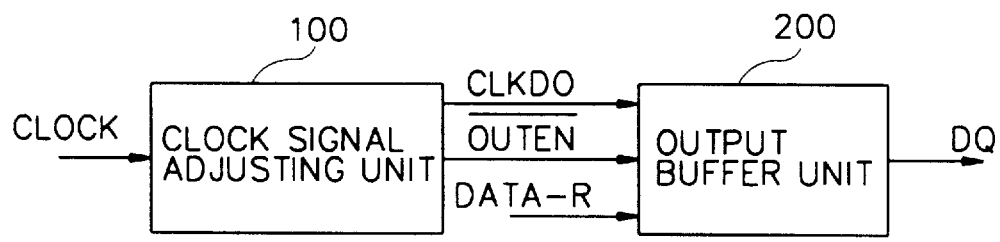
FIG. 1 is a block diagram illustrating a conventional data output buffer for a memory device.
Figure 2:
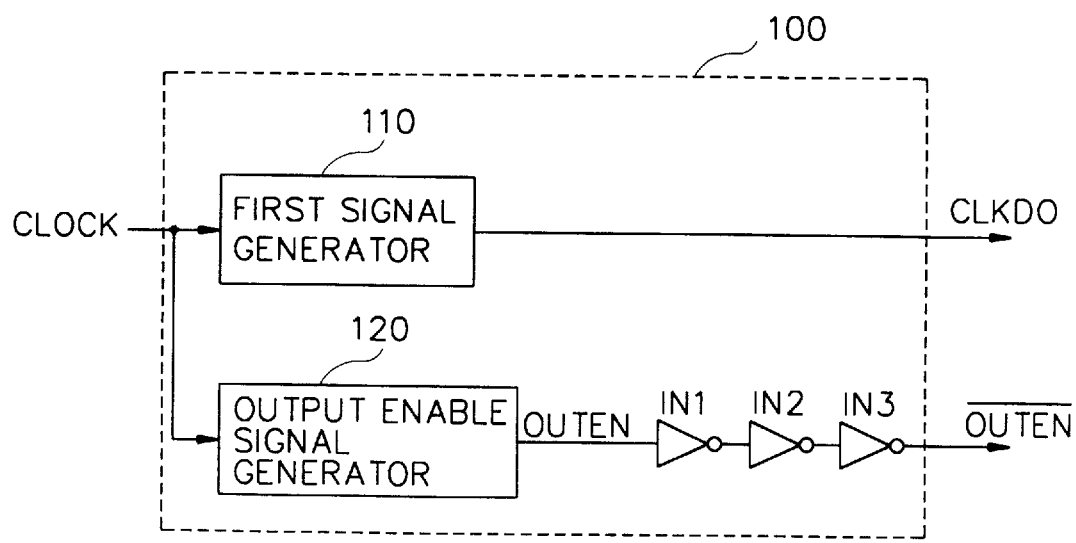
FIG. 2 is a circuit diagram illustrating a clock signal adjusting unit shown in FIG. 1.
Figure 3:
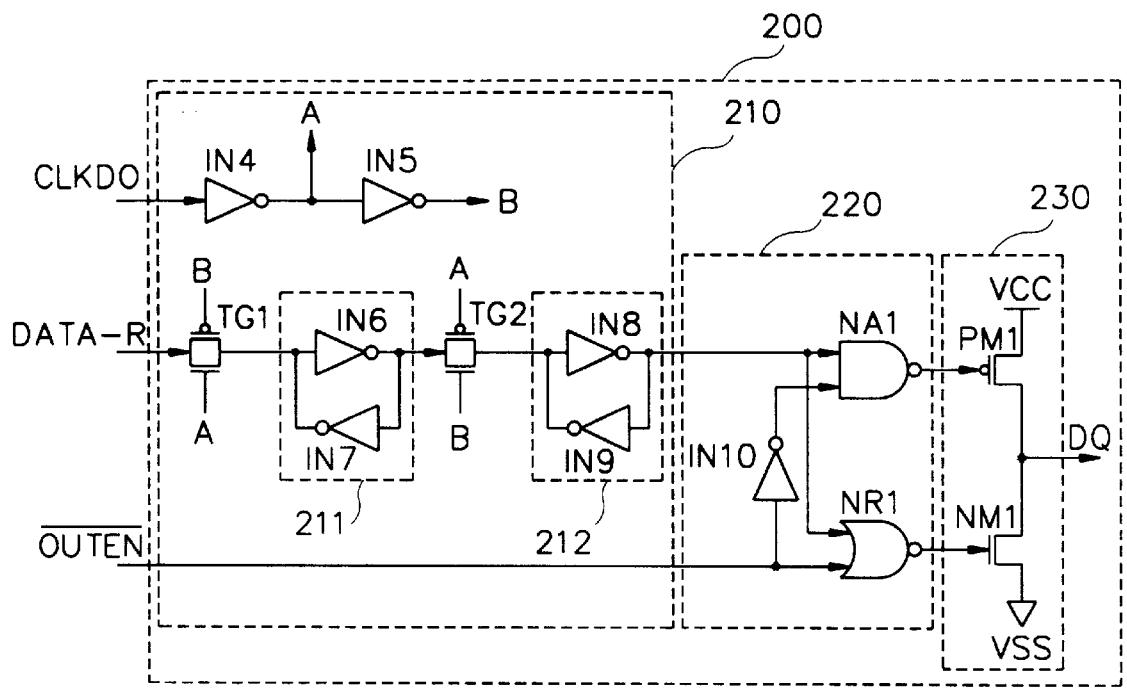
FIG. 3 is a circuit diagram illustrating an output buffer unit shown in FIG. 1.
Figure 4:
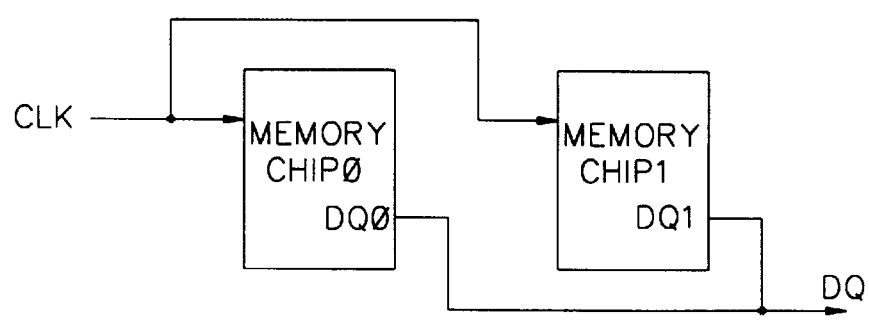
FIG. 4 is a diagram illustrating a modularized conventional data output buffer.

Reference will now be made in detail to the preferred embodiments of the present invention, examples of which are illustrated in the accompanying drawings.

As shown in FIG. 7, a data output buffer for a memory device according to the present invention includes a detection unit 400 for detecting an output data DQ outputted from a device, thereby outputting a detection data X, a clock signal adjusting unit 500 for generating a first signal CLKDO and a second signal $\overline{\text{OUTEN}}$ comparing an output from the detection unit and a data DATA-R in the memory chip for determining a time to output the data DATA-R, and an output buffer unit 600 for outputting the data DATA-R in accordance with the first signal CLKDO and the second signal $\overline{\text{OUTEN}}$ inputted from the clock signal adjusting unit 500.

As shown in FIG. 8, the detection unit 400 further includes a differential amplifier 410 for receiving a reference voltage Vref and the data DQ externally outputted from the memory chip and performing an amplification operation in accordance with a chip enable signal EN, thereby outputting the detection data X.

The clock signal adjusting unit 500, as shown in FIG. 8, includes a first signal generator 510 for outputting the first signal CLKDO determining a time to output a data in accordance with an externally applied clock signal, an output enable signal generator 520 for outputting an output enable signal OUTEN in accordance with the externally applied clock signal, a data compare unit 530 for comparing the detection data X outputted from the detection unit 400 and the data DATA-R to be outputted from the memory chip, and a second signal generator 540 for generating the second signal $\overline{\text{OUTEN}}$ enabling the output buffer unit 600 in accordance with outputs from the data compare unit 530 and the output enable signal generator 520.

Specifically, the data compare unit 530 includes a NAND gate NA2 and a first NOR gate NR2 for performing an inversion AND operation and an inversion OR operation of the detection data X outputted from the detection unit 400 and the data DATA-R, an inverter IN11 for inverting an output from the NAND gate NA2, and a second NOR gate NR3 for performing an inversion OR operation of outputs from the inverter IN11 and the first NOR gate NR2.

The second signal generator 540 includes a first inverter IN12 for inverting an output from the data compare unit 530, a first NAND gate NA3 for performing an inversion AND operation of an output from the first inverter IN12 and an output from the output enable signal generator 520, a second NAND gate NA4 for performing an inversion AND operation of the output from the data compare unit 530 and the output from the output enable signal generator 520, a delay unit D1 for delaying an output from the second NAND gate NA4, a third NAND gate NA5 for performing an inversion AND operation of an output from the delay unit D1 and an output from the first NAND gate NA3, and a second inverter IN13 for inverting an output from the third NAND gate NA5, thereby outputting an inverted signal to the data output buffer unit 600.

Since the first signal generator 510, the output enable signal generator 520, and the output buffer unit 600 have the same construction as the conventional art, the description of the construction will be omitted.

Operation of the data output buffer for a memory device according to the present invention will now be described.

When the detection unit 400 in accordance with the chip enable signal EN detects the data DQ outputted from the memory chip and outputs the detection data X to the data compare unit 530 of the clock signal adjusting unit 500, the data compare unit 530 compares the detection data X outputted from the detection unit 400 with the data DATA-R and then outputs a signal to the second signal generator 540.

The second signal generator 540 outputs the second signal $\overline{\text{OUTEN}}$ which enables the output buffer unit 600 in accordance with an output from the data compare unit 530 and the output enable signal OUTEN outputted from the output enable signal generator 520.

Here, the first signal generator 510 of the clock signal adjusting unit 500 outputs the first signal CLKDO which determines a time to output the data in accordance with the external clock signal.

Then, the output buffer unit 600 externally outputs the data DATA-R in accordance with the first signal CLKDO and the second signal $\overline{\text{OUTEN}}$, both outputted from the clock signal adjusting unit 500.

With reference to the accompanying drawings, the operation of the present invention will now be described in detail.

When the external output data DQ is different from the data DATA-R, the detection unit 400 detects a value of the output data DQ, thereby outputting the detection data X to the clock signal adjusting unit 500.

As shown in FIG. 9A, when an external clock signal is inputted, the clock signal adjusting unit 500 converts the clock signal and thereby generates the output enable signal OUTEN in FIG. 9B and outputs the second signal $\overline{\text{OUTEN}}$ in FIG. 9C which enables the output buffer 600 in accordance with the output enable signal OUTEN.

Meanwhile, in the data compare unit 530 of the clock signal adjusting unit 500, the detection data X outputted from the detection unit 400 and the data DATA-R to be externally outputted are not identical with each other. Therefore, the output from the NAND gate NA2 becomes a high level and the outputs from the inverter IN11 and the first NOR gate NA2 become a low level. The output from the second NOR gate NR3 then becomes a high level, so that a high level output signal is inputted to the second signal generator 540.

Since the output signal from the data compare unit 530 is a high level, as shown in FIG. 9C, the second signal generator 540 receives the output enable signal OUTEN outputted from the output enable signal generator 520, which passes through the delay unit D1, and outputs the second signal $\overline{\text{OUTEN}}$ decreasing a generating speed of an output signal.

After an output buffer unit for another device (not shown) has been off, the output buffer unit 600 is operated in accordance with the first signal CLKDO and the second signal $\overline{\text{OUTEN}}$ outputted from the clock signal adjusting unit 500. As shown in FIG. 9D, the output buffer unit 600 eliminates the skew between the modules and reduces the overlap current, thereby outputting a final output data DQ.

On the other hand, when the external output data DQ is identical with the data DATA-R in the device, the detection unit 400 detects a value of the output data DQ and then outputs a detection data X to the clock signal adjusting unit 500.

As shown in FIG. 10A, when an external clock signal is inputted, the clock signal adjusting unit 500 converts the clock signal and generates an output enable signal OUTEN, as shown in FIG. 10B. FIG. 10C illustrates that the clock signal adjusting unit 500 outputs a second signal OUTEN enabling the output buffer unit 600 in accordance with the output enable signal OUTEN.

In this step, the detection data X inputted from the detection unit 400 and the data DATA-R are identical with each other in the data compare unit 530 of the clock signal adjusting unit 500. An output from the NAND gate NA2 thus becomes a low level and an output from the inverter IN11 becomes a high level. Further, an output from the first NOR gate NR2 becomes a low level and an output from the second NOR gate NR3 becomes a low level. As a result, a low level output signal is inputted to the second signal generator 540.

Thereafter, since the output signal from the data compare unit 530 is a low level, as shown in FIG. 10C, the second signal generator 540 receives the output enable signal OUTEN outputted from the output enable signal generator 520. In this step, since the output enable signal OUTEN does not pass through the delay unit D1, the second signal generator 540 outputs a second signal OUTEN increasing a generating speed of the output signal.

Further, in accordance with the first signal CLKDO and the second signal $\overline{\text{OUTEN}}$ outputted from the clock signal adjusting unit 500, the output buffer unit 600 maintains the data DATA-R in the same memory chip, as shown in FIG. 10D, when an output data DQ is outputted from another memory chip. Thus, the output buffer unit 600 prevents a level of the output data DQ from falling into a level of a termination voltage, thus outputting a final output data DQ, as shown in FIG. 10E.

More specifically, upon comparing the detection data X outputted from the detection unit 400 and the data DATA-R which will externally be outputted, if values of the detection data X and the data DATA-R are not identical with each other, the clock signal adjusting unit 500 decreases the operating speed of the output buffer unit 600, thereby operating the output buffer unit 600 after an output buffer of another device is off.

Conversely, if values of the detection data X and the data DATA-R are identical with each other, the data output buffer increases the operating speed of the output buffer unit 600, thereby maintaining a level of the output data DQ outputted from another memory chip.

As described above, the data output buffer according to the present invention has the following advantages. Since the data output buffer includes the detection unit for detecting an external output data and the data compare unit for comparing an output from the detection unit, a data outputted from the device is capable of eliminating an output noise caused by the overlap current between the memory chip modules. Moreover, the data output buffer in the present invention reduces electric power consumption and increases an operation speed.

It will be apparent to those skilled in the art that various modifications and variations can be made in the data output buffer for memory device of the present invention without departing from the spirit or scope of the invention. Thus, it is intended that the present invention cover the modifications and variations of this invention provided they come within the scope of the appended claims and their equivalents.

What is claimed is:

1. A data output buffer for a memory device having a memory chip, comprising:

a detection unit for detecting an external output data and outputting a detection data;

a clock signal adjusting unit coupled to the detection unit for comparing the detection data from the detection unit and a data outputted from the memory chip in accordance with an externally applied clock signal and outputting a first signal and a second signal; and an output buffer unit coupled to the clock signal adjusting unit and outputting a data in accordance with the first signal and the second signal.

2. The data output buffer according to claim 1, wherein the detection unit includes a differential amplifier for receiving a reference voltage and the external output data and performing an amplification operation in accordance with a chip enable signal, thereby outputting the detection data.

3. The data output buffer according to claim 1, wherein the clock signal adjusting unit includes:

a first signal generator outputting the first signal for determining a time to output the first signal in accordance with an externally applied clock signal;

an output enable signal generator outputting an output enable signal in accordance with the externally applied clock signal;

a data compare unit coupled to the output enable signal generator for comparing the detection data outputted from the detection unit and the data outputted from the memory chip; and a second signal generator coupled to the data compare unit for outputting the second signal enabling the output buffer unit in accordance with outputs from the data compare unit and the output enable signal generator.

4. The data output buffer according to claim 3, wherein the data compare unit includes:

a NAND gate and a first NOR gate performing an inversion OR operation and an inversion AND operation for the detection data outputted from the detection unit and the data outputted from the memory chip;

an inverter inverting an output from the NAND gate; and a second NOR gate performing an inversion OR operation for outputs from the inverter and the first NOR gate.

5. The data output buffer according to claim 3, wherein the second signal generator includes:

a first inverter inverting an output from the data compare unit;

a first NAND gate performing an inversion AND operation for outputs from the first inverter and the output enable signal generator;

a second NAND gate for performing an inversion AND operation for outputs from the data compare unit and the output enable signal generator;

a delay unit delaying an output from the second NAND gate;

a third NAND gate performing an inversion AND operation for outputs from the delay unit and the first NAND gate; and a second inverter inverting an output from the third NAND gate and outputting an inverted signal to the data output buffer unit.

6. The data output buffer according to claim 1, wherein the clock signal adjusting unit compares the detection data from the detection unit with the data from the memory chip to determine when to output the second signal enabling the output buffer unit.

7. The data output buffer according to claim 6, wherein the clock signal adjusting unit determines a time to generate the second signal when the detection data and the data outputted from the memory chip are not identical, by decreasing an operating speed of the output buffer unit, so that the output buffer unit starts operating after an output buffer of another memory chip has been off.

8. The data output buffer according to claim 6, wherein the clock signal adjusting unit determines a time to generate the second signal when the detection data and the data outputted from the memory chip are identical, by increasing an operating speed of the output buffer unit, so that an output from another memory chip is maintained and a level of the output data does not fall into a termination voltage.

* * * * *